United States Patent
Baker et al.

(10) Patent No.: US 6,181,847 B1
(45) Date of Patent: Jan. 30, 2001

(54) OPTICAL SWITCH

(75) Inventors: Robert A. Baker, Cedaredge; Tyler L. Johnson, Frulta; Frederick C. Chandler, Grand Junction, all of CO (US)

(73) Assignee: Ametek, Inc., Paoli, PA (US)

( * ) Notice: Under 35 U.S.C. 154(b), the term of this patent shall be extended for 0 days.

(21) Appl. No.: 09/307,994

(22) Filed: May 10, 1999

(51) Int. Cl.$^7$ .................................................... G02B 6/26
(52) U.S. Cl. ................................. 385/19; 385/16
(58) Field of Search ............... 385/19, 16; 200/DIG. 36, 200/DIG. 37

(56) References Cited

U.S. PATENT DOCUMENTS

| | | |
|---|---|---|
| 3,579,047 | 5/1971 | Sturm et al. . |
| 3,619,591 | 11/1971 | Korski . |
| 3,648,050 | 3/1972 | Koo . |
| 3,683,167 * | 8/1972 | Rishton ..................... 240/1 |
| 3,856,127 | 12/1974 | Halfon et al. . |
| 3,886,544 * | 5/1975 | Narodny ................. 350/96 |
| 4,057,719 | 11/1977 | Lewis . |
| 4,121,884 | 10/1978 | Greenwood . |
| 4,124,879 | 11/1978 | Schoemer . |
| 4,163,883 | 8/1979 | Boulanger . |
| 4,245,886 | 1/1981 | Kolodzey et al. . |
| 4,261,638 | 4/1981 | Wagner . |
| 4,311,990 | 1/1982 | Burke . |
| 4,315,147 | 2/1982 | Harmer . |
| 4,379,968 | 4/1983 | Ely et al. . |
| 4,387,367 | 6/1983 | Fisher . |
| 4,437,728 | 3/1984 | Ohashi . |
| 4,480,184 | 10/1984 | Ely . |
| 4,591,712 | 5/1986 | Thalmann . |
| 4,641,026 | 2/1987 | Garcia, Jr. . |
| 4,705,348 * | 11/1987 | Matsunaga et al. ............... 350/96.15 |
| 4,764,739 | 8/1988 | Salour . |
| 4,836,636 | 6/1989 | Obara et al. . |
| 5,004,318 * | 4/1991 | Ohashi ................. 350/96.2 |
| 5,034,602 | 7/1991 | Garcia, Jr. et al. . |
| 5,077,813 | 12/1991 | Dorsel et al. . |
| 5,201,016 | 4/1993 | Jinbo et al. . |
| 5,317,667 | 5/1994 | Weber et al. . |
| 5,923,798 * | 7/1999 | Aksyuk et al. ..................... 385/19 |

OTHER PUBLICATIONS

Hewlett Packard, "Light Guide Techniques Using LED Lamps," Optoelectronics Division Application Brief I–003, pp. 1–28 (1993).

A. M. Blumenfeld et al., "Parts That Glow: Design techniques for controlling light in illuminated acrylic plastic parts," The Penton Publishing Co., pp. 2–11 (1959).

Society of Automotive Engineers, Inc., "Design, Layout, Criteria—Plastic Integrally Lighted Panels," Aerospace Recommended Practice, ARP 498A, pp. 1–15 (1968).

* cited by examiner

Primary Examiner—Frank G. Font
Assistant Examiner—Layla Lauchman
(74) Attorney, Agent, or Firm—Ratner & Prestia (57) ABSTRACT

An illumination source transmits light through a transmitting light pipe to an optical switch. A first receiving light pipe is aligned with and spaced from the first transmitting light pipe to form a first gap therebetween. The switch includes a switch cap adapted to be disposed in a first position and in a second position. A first light transmitting tower is coupled to the switch cap and extends from the switch cap into the first gap when the switch cap is disposed in at least one of the first position and the second position. A first opaque blade extends from the switch cap and adjacent to the first light transmitting tower and is adapted to extend into the first gap to prevent light from being transmitted to the first end of the first receiving light pipe in one of the first position or the second position. In other embodiments, a switch and a method for using the switch enable illumination of only a portion of the switch cap regardless of the switch position. Preferably, the switch and method allow for illumination of different portions of the switch cap when the switch is in corresponding different positions.

25 Claims, 10 Drawing Sheets

FIG. 10

OPTICAL SWITCH

TECHNICAL FIELD

The present invention relates generally to switching and, more particularly, to an illuminated optical switch.

BACKGROUND OF THE INVENTION

Vehicles such as automobiles, trucks, and aircraft often include multiple electrical switches located on an operator control panel. Each electrical switch independently switches electric current flowing in copper wires to control a vehicle function. Such functions may include turning on a vehicle's lights, operating windows, etc.

It is desirable that a switch be illuminated for improved visibility of the switch. A switch may be illuminated by a lamp located behind the switch. Illumination by a separate lamp introduces additional design and manufacturing costs to account for the lamp while reducing reliability due to possible lamp failure.

Electrical switches function by opening or closing an electrical circuit. A switch is opened by separating a first electrical contact from a second electrical contact. A switch is closed by connecting the first electrical contact to the second electrical contact.

When an electrical switch controls a high current, each opening or closing of the electrical circuit may cause a spark to jump between the two electrical contacts. This spark may blast off a portion of one of the electrical contacts possibly resulting in premature wear and premature failure of the switch. Alternatively, when a switch controls a low current circuit, corrosion may build up on the first and second contacts. Over time, the corrosion may accumulate and a switch may fail because a conductive path is not formed when the first and second electrical contacts are connected.

SUMMARY OF THE INVENTION

To achieve these and other objects, and in view of its purposes, the present invention provides an optical switch. According to an embodiment of the present invention, a first transmitting light pipe has a first end aligned with and spaced from a first end of a first receiving light, forming a first gap therebetween. A switch cap is adapted to be disposed in a first position and in a second position. A first light transmitting tower is coupled to the switch cap and extends from the switch cap into the first gap when the switch cap is disposed in at least one of the first position and the second position. A first opaque blade extends from the switch cap and adjacent to the first light transmitting tower and is adapted to extend into the first gap to prevent light from being transmitted to the first end of the first receiving light pipe in one of the first position or the second position.

According to another embodiment of the present invention, an optical switch includes a first transmitting light pipe having a first end and a second end. A first illumination source is coupled to the second end of the first transmitting light pipe for transmitting light into the second end and toward the first end of the first transmitting light pipe. A first receiving light pipe has a first end and a second end, wherein the first end of the first receiving light pipe is aligned with and spaced from the first end of the first transmitting light pipe to form a first gap therebetween. A switch cap is adapted to be disposed in a first position and in a second position. The switch cap includes a first cap portion and a second cap portion. A first light transmitting is coupled to the first cap portion and extends from the first cap portion into the first gap when the switch cap is disposed in the first position and into a position away from the first gap when the switch cap is disposed in the second position. When the switch cap is disposed in the first position, light transmitted by the first illumination source into the first transmitting light pipe is transmitted through the first end of the first transmitting light pipe and into the first light transmitting tower to illuminate the first portion of the switch cap. When the switch cap is disposed in the second position, light transmitted by the first illumination source into the first transmitting light pipe is transmitted through the first gap into the first receiving light pipe.

According to yet another embodiment of the present invention, a method of using an optical switch is provided. The optical switch includes a switch cap having a first cap portion. The method includes receiving light from a light source. The light is then directed into a gap opposite a receiving light pipe. The optical switch is then selectively actuated to one of a first position in which the light is transmitted across the gap to the light receiving pipe or a second position in which the light is directed away from the light receiving pipe. Light is transmitted from the gap to the first cap portion to illuminate the first cap portion when said switch is in at least one of the first position and the second position.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

Figure 1:
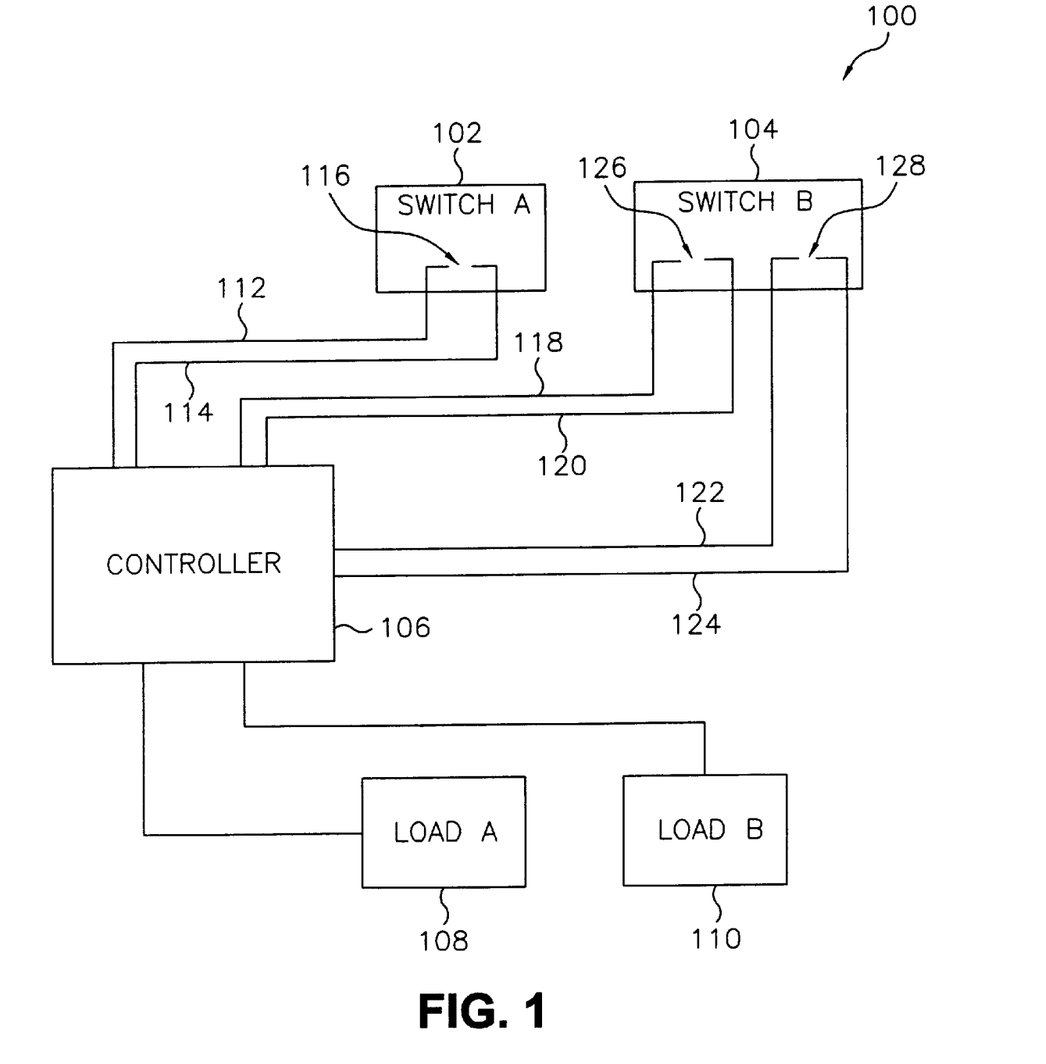
FIG. 1 shows a control system including an optical switch according to the present invention.

Referring now to the drawing, in which like reference numerals refer to like elements throughout, FIG. 1 shows a control system 100 including optical switches 102, 104 according to the present invention.

The first switch 102 and the second switch 104 are coupled to a controller 106. The controller 106 controls a first load 108 and a second load 110 responsive to signaling from the first and second switches 102, 104. FIG. 1 shows a control system 100 having two switches 102, 104 and two loads 108, 110. As known to those skilled in the art, the controller may be programmable and the present invention may have multiple switches and multiple loads which do not necessarily correspond to each other.

The first switch 102 is coupled to the controller 106 by a first light transmitting pipe 112 and a first light receiving pipe 114. The controller 106 includes a photodetector (not shown) for detecting an intensity of light received from the light receiving pipe 114. The first light transmitting pipe 112 and the first light receiving pipe 114 are aligned with and spaced from each other forming a gap 116. Signaling between the first switch 102 and the controller 106 is performed by first transmitting light along the first transmitting light pipe 112 toward the first switch 102. The first switch 102 may then indicate a switch position to the controller 106 by allowing the light to be transmitted to the controller through the first receiving light pipe 114, by attenuating the light returned back to the controller 106, or by blocking the light returned back to the controller 106 along the first receiving light pipe 114. The controller 106 detects the difference or change in light intensity and uses the detected intensity to determine a corresponding switch 102, 104 position. The controller 106 may then control a load such as the first and second loads 108, 110 responsive to the determined switch 102, 104 position.

The present invention is described above using light pipes comprised of optical quality plastic. Light pipe technology is known to those skilled in the art as described by the Hewlett-Packard Co. in *Light Guide Techniques Using LED Lamps*, Optoelectronics Division Application Brief I-003, 1-28 (1993), and described by Blumenfeld et al. in *Parts That Glow* 2-11 (1959). As known to those skilled in the art, the teachings of the present invention may be applied using other light transmission media such as optical fibers.

The second switch 104 is coupled to the controller 106 by second and third light transmitting pipes 118, 122 and by second and third light receiving pipes 120, 124. The second light transmitting pipe 118 and the second light receiving pipe 120 are aligned with and spaced from each other forming a gap 126. The third light transmitting pipe 122 and the third light receiving pipe 124 are aligned with and spaced from each other to form a gap 128.

Figure 2:
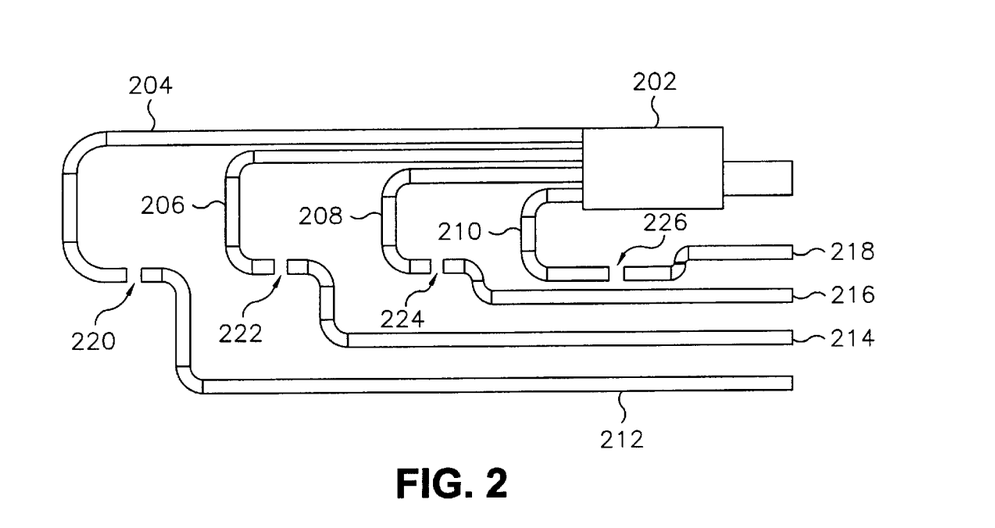
FIG. 2 shows a configuration of light pipes according to an exemplary embodiment of the present invention.
Figure 3:
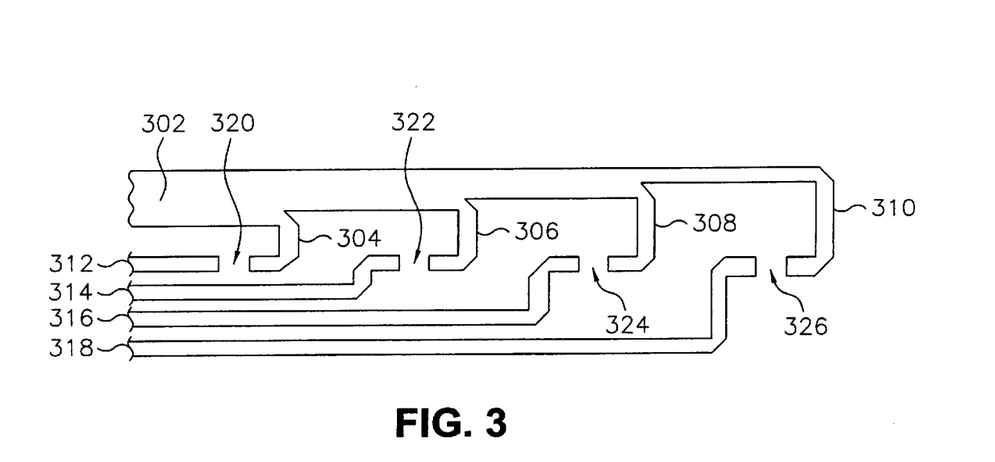
FIG. 3 shows a configuration of light pipes according to another exemplary embodiment of the present invention.

FIGS. 2 and 3 show exemplary configurations of light pipes according to the present invention. In FIG. 2, a single light source 202 illuminates first, second, third, and fourth transmitting light pipes 204, 206, 208, 210. Each transmitting light pipe 204, 206, 208, 210 has a corresponding first, second, third, and fourth receiving light pipe 212, 214, 216, 218. The transmitting and receiving light pipes in FIG. 2 are aligned with and spaced from each other forming gaps 220, 222, 224 and 226.

FIG. 3 shows another exemplary configuration of light pipes according to the present invention. A single light source (not shown) may transmit light along a single base light pipe 302. First, second, third, and fourth transmitting light pipes 304, 306, 308, 310 may be formed by tapping off of the base light pipe 302. The configuration shown in FIG. 3 includes receiving light pipes 312, 314, 316, 318 and gaps 320, 322, 324 and 326, similar to those shown in FIG. 2.

Although the light pipes in FIGS. 2 and 3 are illustrated as four pairs of transmitting and receiving light pipes, the present invention is not limited to only four pairs of transmitting and receiving light pipes. In practice, configurations of light pipes as shown in FIGS. 2 and 3 may be manufactured as a larger number of pairs of transmitting and receiving light pipes. For example, light pipes may be manufactured as 30 pairs of transmitting and receiving light pipes. According to the specific needs of a particular switch console, the 30 pairs of transmitting and receiving light pipes may be configured to accommodate any number of switches between one switch and 30 switches by snapping off the unneeded light pipes. In an exemplary embodiment the light pipes comprise an optical quality plastic such as polycarbonate or acrylic.

Figure 4:
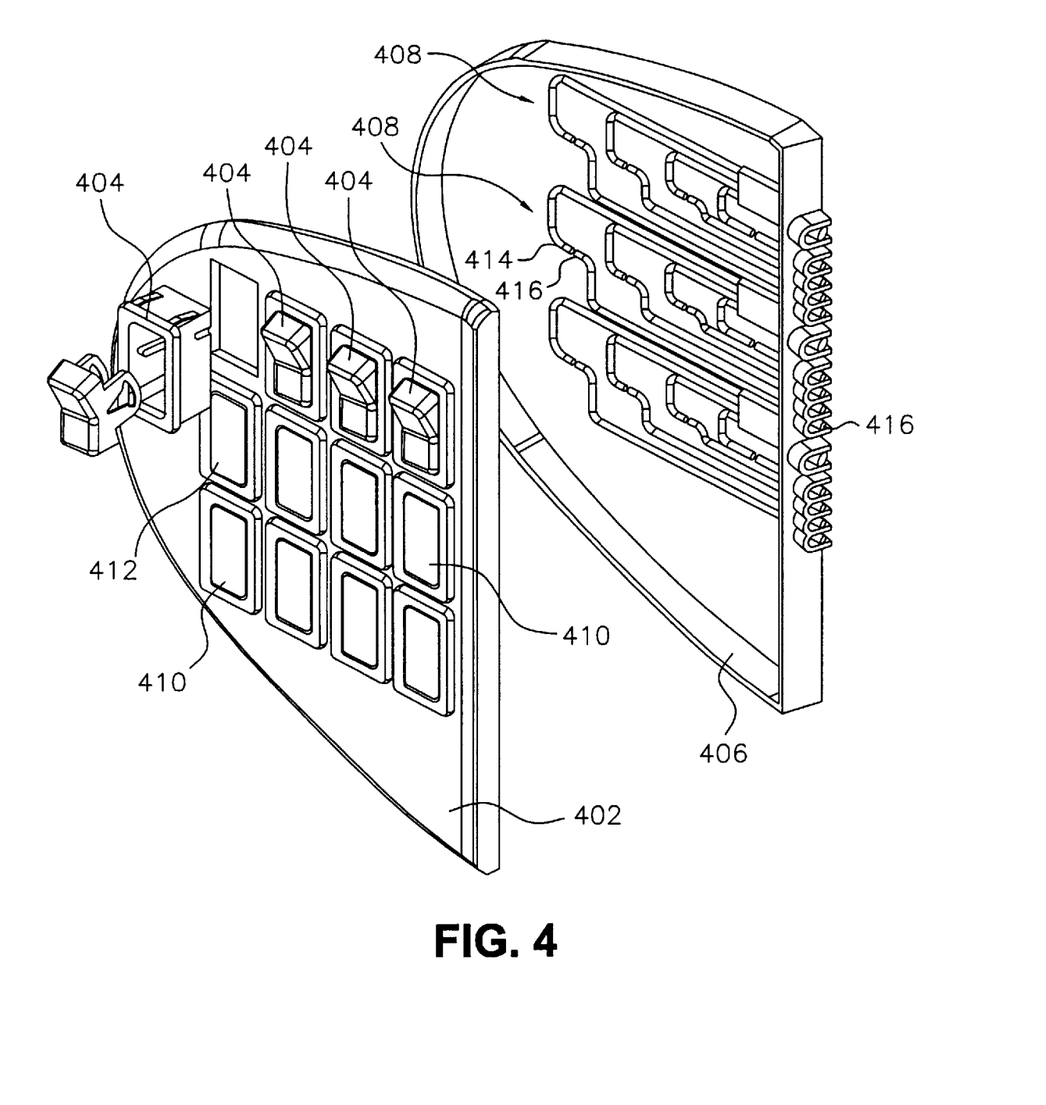
FIG. 4 shows an expanded perspective view of a console of switches and their corresponding light pipes according to the present invention.

FIG. 4 shows an expanded view of a console 402 including multiple switches 404. A back plate 406 includes light pipes 408 corresponding to the switches 404. The console 402 includes plates 410 in positions where switches are not needed. The present invention allows a control system to be easily configurable by allowing the addition or removal of switches 404. For example, plate 412 has a corresponding transmitting light pipe 414 and a corresponding receiving light pipe 416. If an additional control function is desired, plate 412 may be replaced with a switch 404, and controller 106 (FIG. 1) may be programmed to monitor receiving light pipe 416 and to control a corresponding load responsive to the intensity of light monitored from the receiving light pipe 416.

Figure 5:
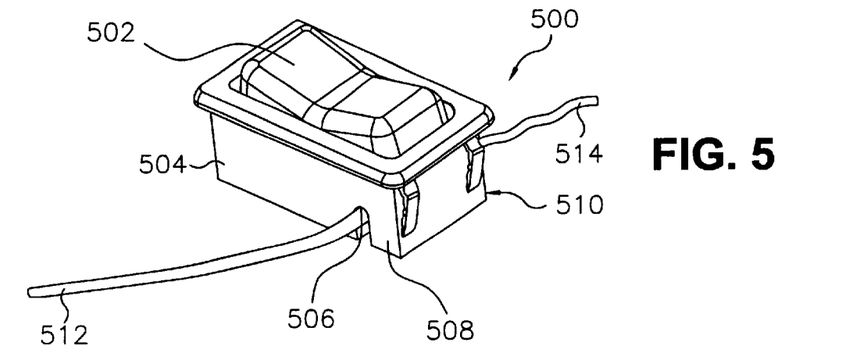
FIG. 5 is a perspective view of a first exemplary switch according to the present invention.
Figure 5A:
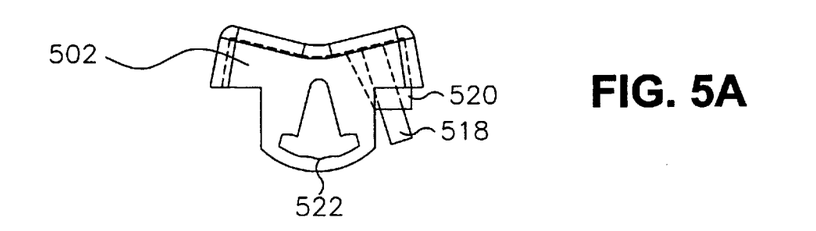
FIG. 5A is a side view of a switch cap of the switch shown in FIG. 5.
Figure 5B:
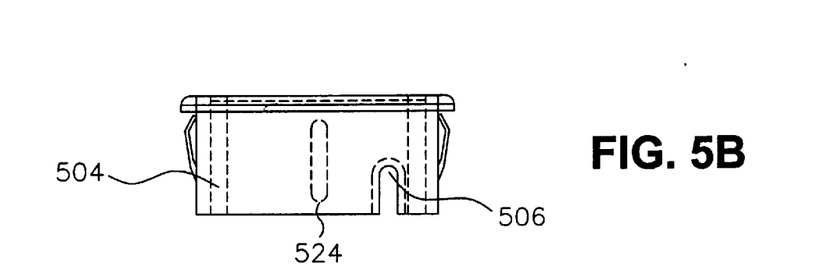
FIG. 5B is a side view of a housing of the switch shown in FIG. 5.
Figure 5C:
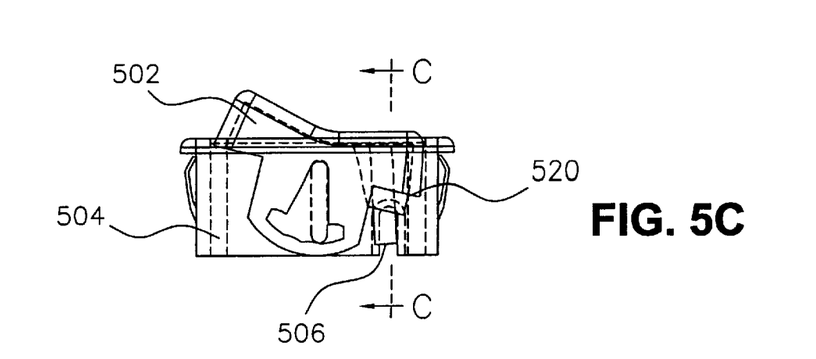
FIG. 5C is a side view of the assembled switch shown in FIG. 5.

FIG. 5 is a perspective view of a first exemplary optical switch 500 according to the present invention. As shown in FIGS. 5A and 5B, the switch 500 includes a switch cap 502 and a housing 504. FIG. 5C is a cross sectional view of the assembled switch 500.

In this exemplary embodiment, the housing 504 includes a first side 508 and a second side 510, opposite the first side 508. The housing 504 includes an aperture 506 in the first side 508 through which a first transmitting light pipe 512 extends. A similar aperture (not shown) is formed on the second side 510 through which a first receiving light pipe 514 extends. In other embodiments, the housing 504 may be sufficiently thick such that the light pipes 512, 514 extend only into the two sides 508, 510 of the housing 504.

The first receiving light pipe 514 is aligned with and spaced from the first transmitting light pipe 512 forming a first gap 516 therebetween (see FIGS. 5D–I). The switch cap 502 is adapted to be disposed in at least a first position and in a second position. (i.e., with one half of switch cap 502 depressed, as shown in FIG. 5C, or with the other half of switch cap 502 depressed). One or more intermediate positions may be available by forming a ridge 522 in switch cap 502 which cooperates with member 524 of housing 504.

A first light transmitting tower 518 is coupled to the switch cap 502 and extends from the switch cap 502 into the first gap 516 when the switch cap 502 is disposed in the first position. Although not shown, the components could be formed on the other half of the switch such that first light transmitting tower 518 would extend into the first gap 516 when the switch cap 502 is disposed in the second position. When light transmitted along the first transmitting light pipe 512 is coupled to the first light transmitting tower 518, the first transmitting light tower 518 directs the light up the tower 518 to the switch cap 502 to illuminate at least a portion of the switch cap 502. The switch cap 502 may be illuminated or not illuminated depending on whether the tower 518 is in the path or out of the path of the light transmitted from the first transmitting light pipe 512. In an exemplary embodiment, the first light transmitting tower 518 comprises optical quality plastic.

A first opaque blade 520 extends from the switch cap 502, adjacent to the first light transmitting tower 518, into the first gap 516 to prevent light from being transmitted from the first transmitting light pipe 512 to the first receiving light pipe 514 in one of the first position or the second position. In an exemplary embodiment, the first opaque blade 520 is adjacent to but separated from the first light transmitting tower 518. In an exemplary embodiment, the first opaque blade 520 is separated from the first light transmitting tower 518 by a distance 526 (see FIG. 5D) ranging from approximately 0.01 inches to 0.06 inches. In another exemplary embodiment, the distance 526 between the first opaque blade 520 and the first light transmitting tower 518 is 0.03 inches.

In an exemplary embodiment, an optical switch according to the present invention is formed without a housing 504. It is not necessary that a transmitting light pipe and a corresponding receiving light pipe be coupled to the optical switch by a housing nor that they be coupled to the switch by a component of the switch. For example, as shown in FIG. 4, a transmitting light pipe 414 and a corresponding receiving light pipe 416 may be secured to a back plate 406. A switch without a housing may then be secured to the back plate 406 so its first opaque blade 520 extends from the switch cap 502 adjacent to the first light transmitting tower 518 into the first gap 516 to prevent light from being transmitted from the transmitting light pipe 414 to the receiving light pipe 416 in one of the first position or the second position.

FIGS. 5D–I are cross sectional views of the switch 500 taken along line C—C in FIG. 5C. FIGS. 5D–I illustrate different exemplary configurations of the length of the first light transmitting tower 518 in combination with different orientations of the first light transmitting tower 518 and the first opaque blade 520 with respect to the first transmitting and receiving 512, 514 light pipes. Each pair (i.e., FIGS. 5D/5E, 5F/5G, and 5H/5I) shows the same configuration in different switch positions.

When the first transmitting light tower 518 is in the path of the light transmitted from the first transmitting light pipe 512, the switch cap 502 is illuminated and the switch cap is defined to be "on". When the first opaque blade 520 does not extend into the first gap 516, the switch is defined to be "on". Table 1 below illustrates whether the switch cap ("cap" below) is "on" or "off" and whether the switch is "on" or "off" for the configurations shown in FIGS. 5D–I.

TABLE 1

Figure 5D:
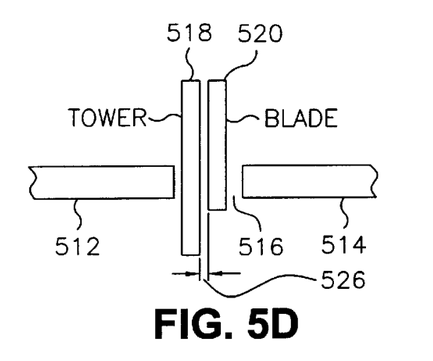
FIGS. 5D–I are partial cross-sectional views taken along line C—C in FIG. 5C showing different switch positions in combination with different tower and blade configurations.
Figure 5E:
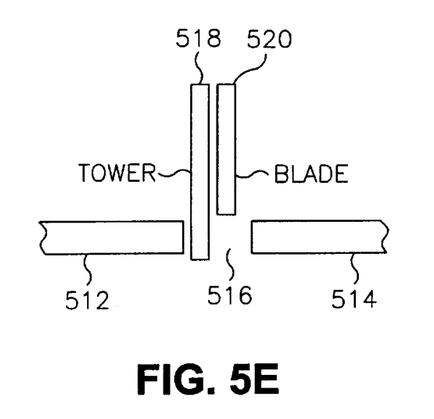
Figure 5F:
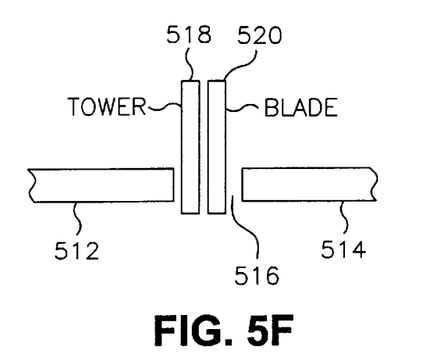
Figure 5G:
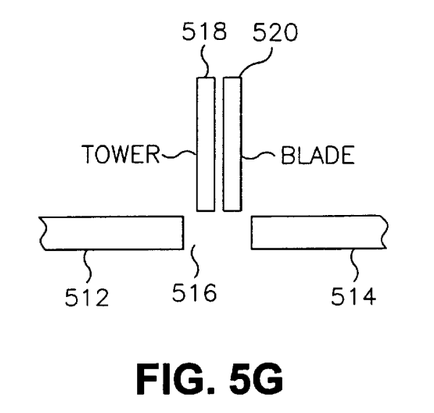
Figure 5H:
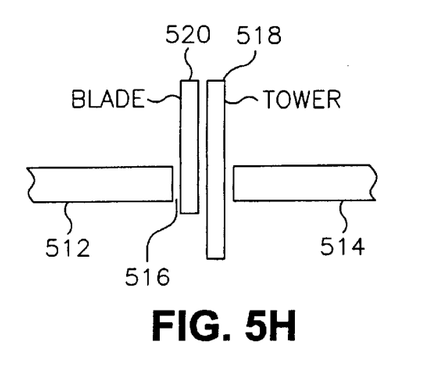
Figure 5I:
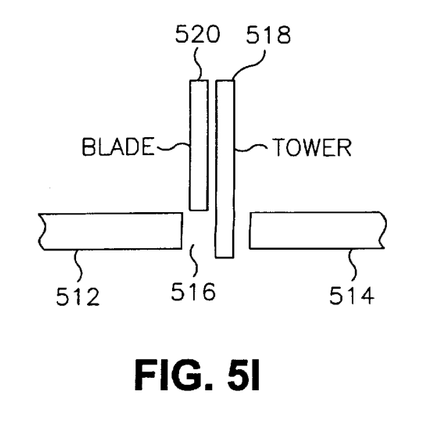

| FIG. 5D | Cap | On |
|---|---|---|
| | Switch | Off |
| FIG. 5E | Cap | On |
| | Switch | On |
| FIG. 5F | Cap | On |
| | Switch | Off |
| FIG. 5G | Cap | Off |
| | Switch | On |
| FIG. 5H | Cap | Off |
| | Switch | Off |
| FIG. 5I | Cap | On |
| | Switch | On |

Figure 6A:
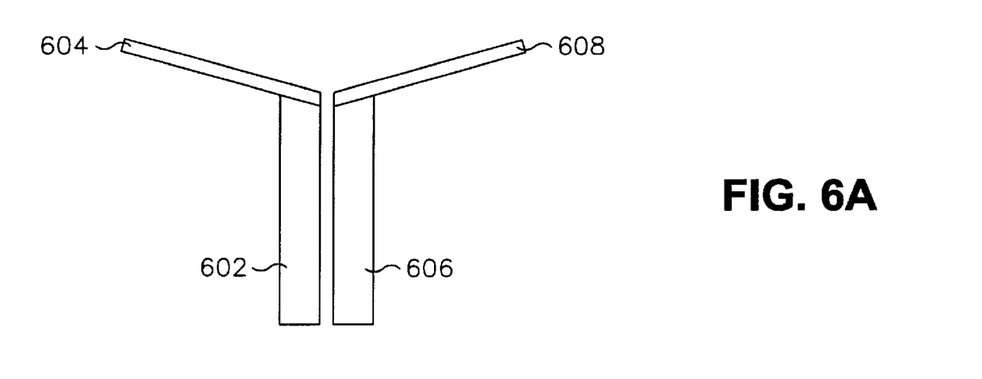
FIG. 6A is a side view of a switch cap and corresponding light towers of a second exemplary switch according to the present invention.
Figure 6B:
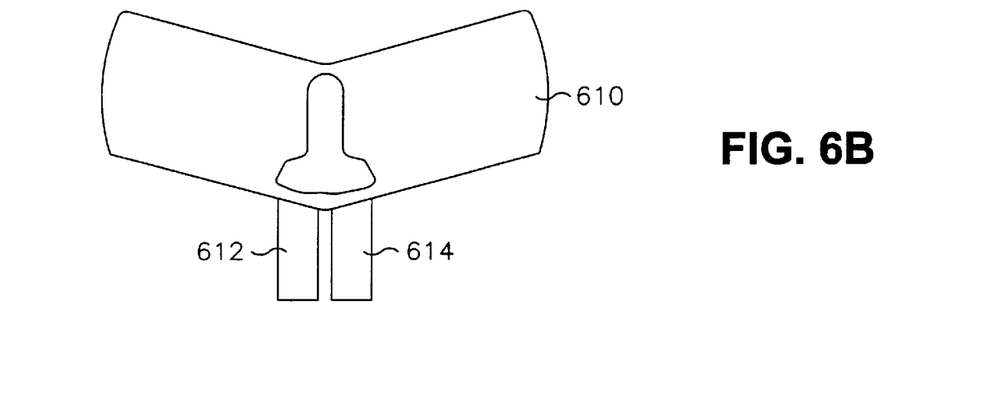
FIG. 6B is a side view of a rocker of the second exemplary switch according to the present invention.
Figure 6C:
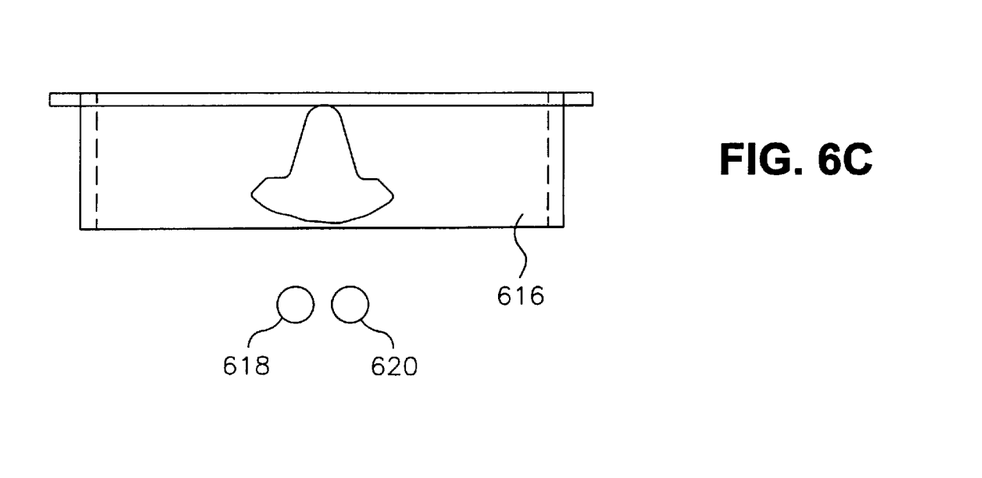
FIG. 6C is a housing of the second exemplary switch according to the present invention.
Figure 6D:
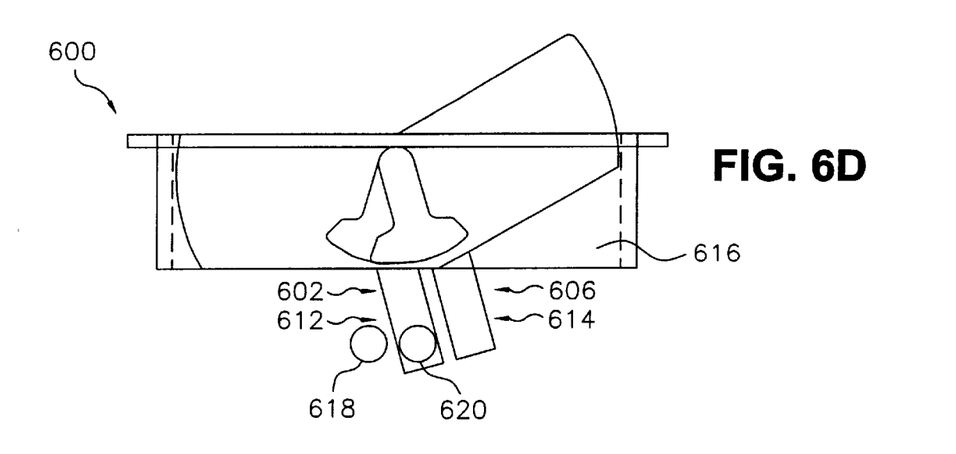
FIGS. 6D, 6E, and 6F are side views of the second exemplary switch according to the present invention in three different positions.
Figure 6E:
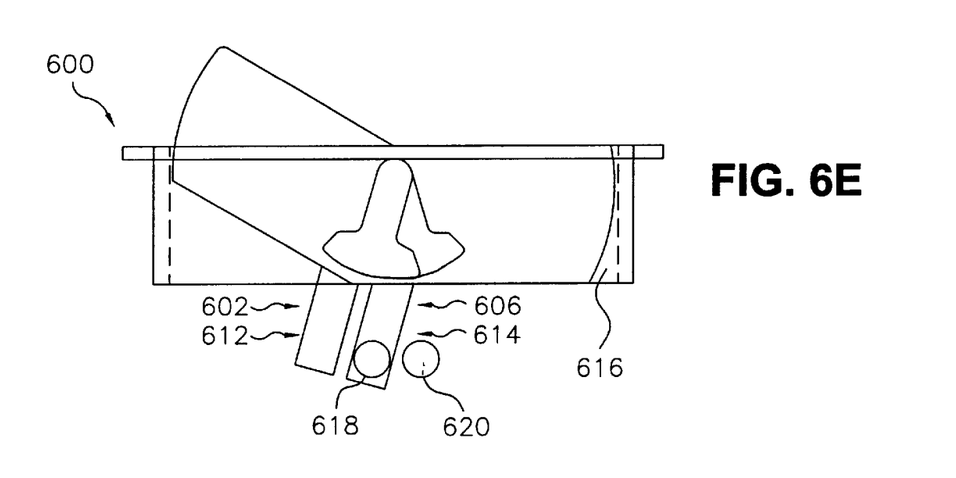
Figure 6F:
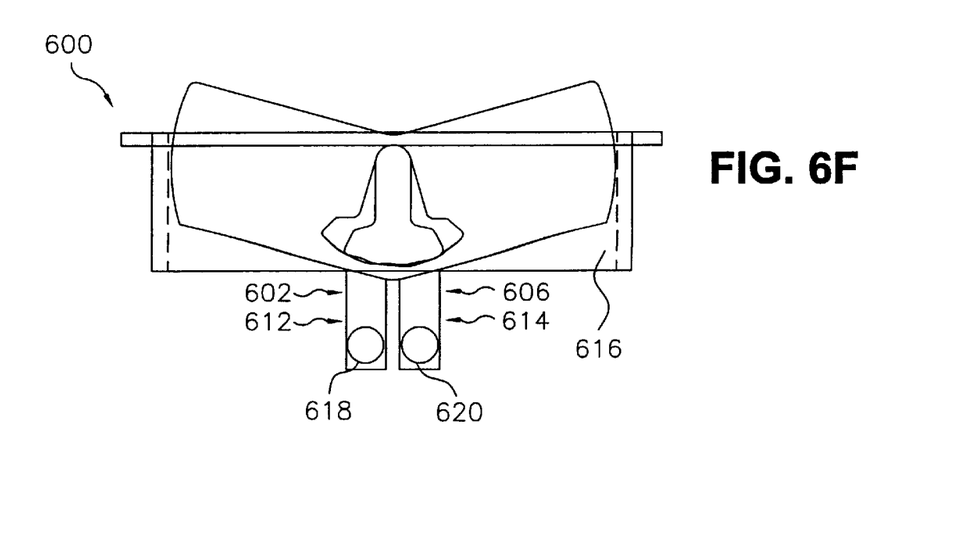

FIGS. 6A–C illustrate the structure of and FIGS. 6D–F illustrate the operation of a second exemplary assembled switch 600 according to the present invention. Each of FIGS. 6A–C show disassembled components of the switch 600.

FIG. 6A shows a first light transmitting tower 602 coupled to a first portion 604 of the switch cap and a second light transmitting tower 606 coupled to a second portion 608 of the switch cap. FIG. 6B shows a first opaque blade 612 and a second opaque blade 614 coupled to a rocker 610. FIG. 6C shows a housing 616. The towers 602, 606, switch cap portions 604, 608, rocker 610, blades 612, 614, and housing 616 may be assembled to form a switch 600 shown in FIGS. 6D–F.

In this exemplary embodiment, the switch 600 is adapted to be disposed in a first position as shown in FIG. 6D, a second position as shown in FIG. 6E, and in a third position as shown in FIG. 6F. In this exemplary embodiment, the switch 600 includes two towers 602, 606 and two blades 612, 614 and is configured for switching first and second pairs of transmitting and receiving light pipes located at positions 618 and 620, respectively. As known to those skilled in the art, the teachings of the present invention are not limited to a particular number of switch positions, towers, blades, or light pipes, nor do the number of towers and blades necessarily need to correspond to one another.

When the switch 600 is in the first position as shown in FIG. 6D, the first blade 612 is in position 620 and blocks light ("off") from the second transmitting light pipe from reaching the second receiving light pipe. The light from the second transmitting light pipe is coupled through the first tower 602 to the first portion 604 of the switch cap to illuminate the first portion 604 of the switch cap ("on"). Light from the first transmitting light pipe is not blocked ("on") and is coupled to the first receiving light pipe. The second portion 608 of the switch cap is not illuminated ("off") because the second tower 606 is not in the path of one of the first or second transmitting light pipes. The illumination of the first and second portions 604, 608 of the switch cap and the switching of light in the first and second pairs of transmitting and receiving light pipes is summarized in Table 2 below.

TABLE 2

| | Cap Illumination | | Switching | |
|---|---|---|---|---|
| | First Portion | Second Portion | First Pipe | Second Pipe |
| FIG. 6D | On | Off | On | Off |
| FIG. 6E | Off | On | Off | On |
| FIG. 6F | On | On | Off | Off |

In an exemplary embodiment, a monochromatic light source transmits light of a first color or wavelength through the first transmitting light pipe and another monochromatic light source transmits light of a second color or wavelength through the second transmitting light source. This results in the illumination of the switch cap being illuminated with a different color depending on the position of the switch.

Figure 7:
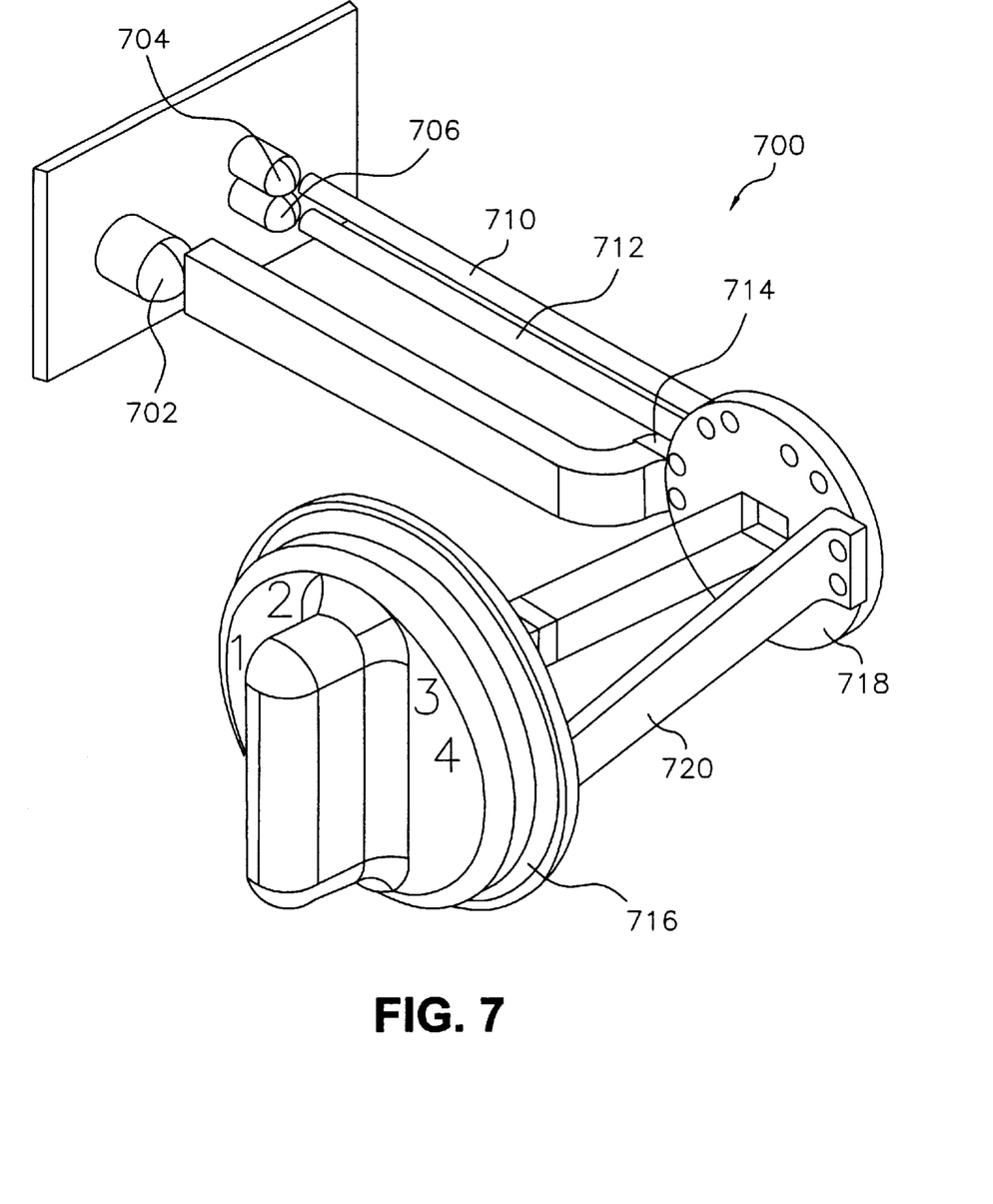
FIG. 7 is a rotary switch according to the present invention.

FIG. 7 shows a rotary switch 700 according to an exemplary embodiment of the present invention. A light source 702 transmits light into an end of a transmitting light pipe 708. The opposite end of the transmitting light pipe is aligned with and spaced from a first receiving light pipe 710 and a second receiving light pipe 712, forming a gap 714 therebetween. The first and second receiving light pipes 710, 712 are adapted to transmit light received from the transmitting light pipe into a first photodetector 704 and second photodetector 706, respectively.

A switch cap 716 is coupled to and controls the rotation of a disk 718. The switch 700 is indexed to have four positions and for one of four positions of the disk 718 to be in the gap 714 in each of the four positions. Each of the four positions may block ("off") or let pass ("on") light from the transmitting light pipe 708 to one or both of the receiving light pipes 710, 712.

Each of the four positions has a corresponding indicator (or cap portion) "1", "2", "3", and "4" on the switch cap 716 which may be illuminated. Each indicator may be illuminated by a light tower 720. The light tower 720 in FIG. 7 corresponds to indicator "4". For clarity, light towers corresponding to other indicators are omitted from FIG. 7. When the switch cap 716 is rotated to its fourth position, the light tower 720 will be within the path of light transmitted from the transmitting light pipe 708 and will couple the light to for illuminating the indicator "4".

As known to those skilled in the art, the light tower 720 may comprise an optical quality plastic so light from the transmitting light pipe 708 is transmitted through the light tower 720 to its corresponding indicator while also being coupled to one or both of the receiving light pipes 710, 712 depending on the position and configuration of the disk 718.

As known to those skilled in the art, a switch 700 as shown in FIG. 7 may include four light towers 720 each corresponding to a separate indicator which are coupled to a single disk (not shown) of optical quality plastic in the switch cap 716. Light transmitted along the tower 720 will provide the brightest illumination to its corresponding indicator which light will also dissipate into the disk to provide a lesser amount of illumination to the remaining indicators.

Switches according to the present invention are not limited to a particular number of positions. For example, the rotary switch 700 in FIG. 7 may be adapted to have more or less than 4 discrete positions. As known to those skilled in the art, the number of receiving light pipes may be correspondingly increased or decreased with the number of positions of the switch.

The teachings of the present invention are not limited to rocker switches as shown in FIGS. 5 and 6 or to rotary switches as shown in FIG. 7. For example, a switch similar to that described above with regard to FIGS. 6A–F may be configured as a toggle switch 800 as shown in FIG. 8 or as a slide switch 900 as shown in FIG. 9.

Figure 8:
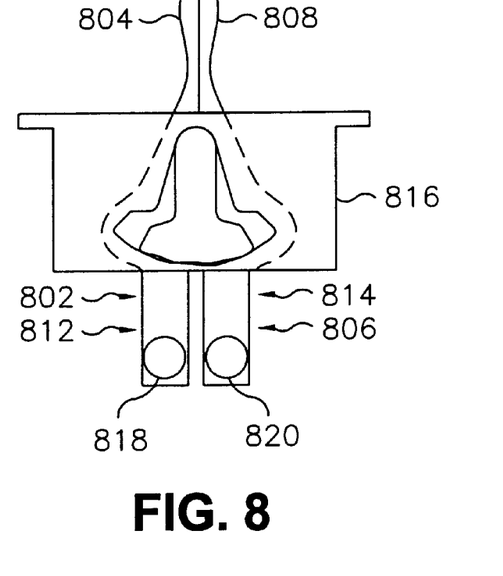
FIG. 8 is a toggle switch according to the present invention.

The toggle switch 800 shown in FIG. 8 includes a housing 816, a first blade 812, a first light transmitting tower 802, a second blade 814, and a second light transmitting tower 806 similar to switch 600 in FIGS. 6A–F. The toggle switch 800 has a first cap portion 804 and a second cap portion 808. The towers 802, 806 and blades 812, 814 are configured for switching first and second pairs of transmitting and receiving light pipes located at positions 818 and 820. The switch 800 is shown in FIG. 8 in a position similar to switch 600 shown in FIG. 6F and both the first and second cap portions 804, 808 are "on" and both the first and second pipes are "off". The toggle switch 800 may be actuated to the left and to the right into positions similar to those shown in FIGS. 6D and 6E to provide illumination and signaling as shown in Table 2.

Figure 9:
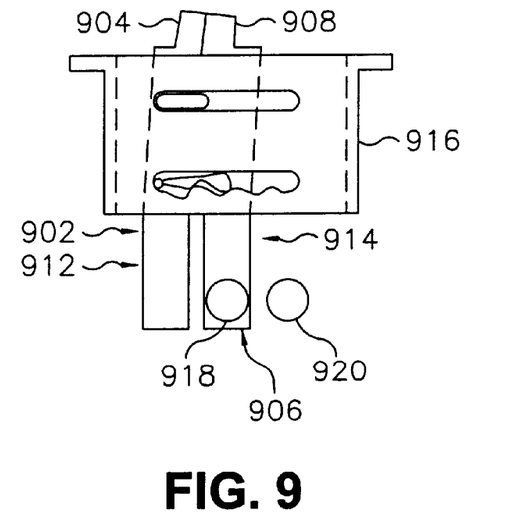
FIG. 9 is a slide switch according to the present invention.

The slide switch 900 in FIG. 9 includes a housing 916, a first blade 912, a first light transmitting tower 902, a second blade 914, and a second light transmitting tower 906 similar to switch 600 in FIGS. 6A–F. The slide switch 900 has a first cap portion 904 and a second cap portion 908. The towers 902, 906 and blades 912, 914 are configured for switching first and second pairs of transmitting and receiving light pipes located at positions 918 and 920. The switch 900 is shown in FIG. 9 in a left position where the second cap portion 908 is "on" and the first pipe is "off" similar to the position of switch 600 shown in FIG. 6E. The slide switch 900 may be actuated to a center position similar to switch 600 shown in FIG. 6F and to a right position similar to switch 600 shown in FIG. 6D to provide illumination and signaling as shown in Table 2.

Figure 10:
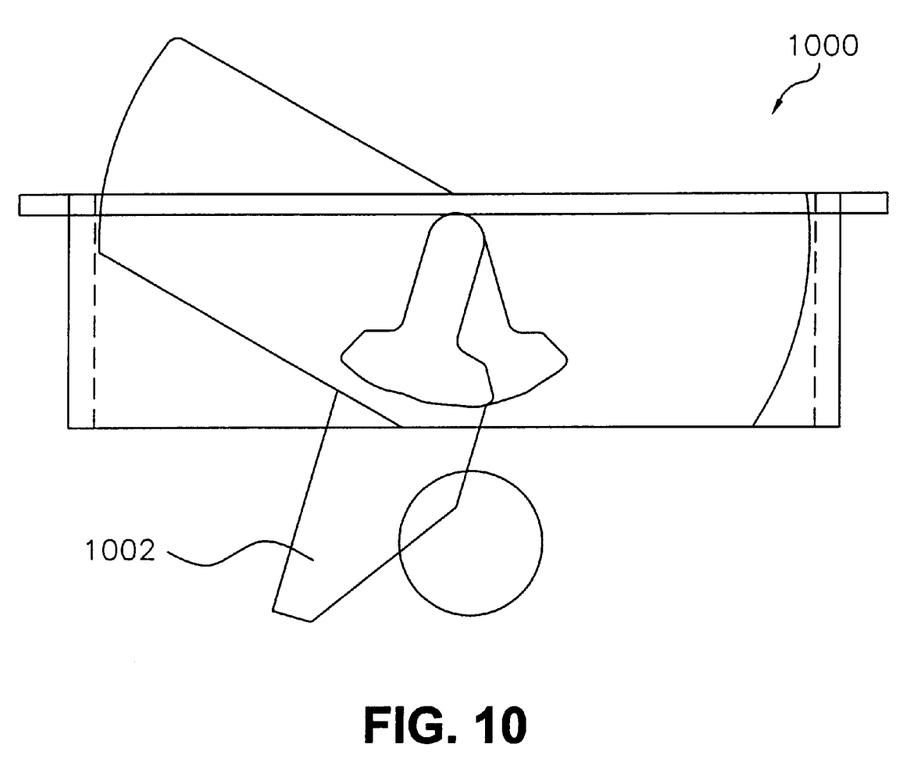
FIG. 10 is a partial cross-sectional view of another exemplary switch according to the present invention.

The present invention is described above as providing discrete switching illumination steps and discrete signaling steps. As known to those skilled in the art, the teachings of the present invention may be adapted to provided non-discrete or linear illumination and signaling. For example, as shown in FIG. 10, a switch 100 may include a tower and/or blade 1002 which is tapered to allow non-discrete variations in light intensity transmitted to the controller through a receiving light pipe and to allow non-discrete variations of intensity of illumination of the switch cap.

The present invention provides a less expensive and more reliable switching apparatus and method than conventional electrical switching and illuminating techniques. A cost savings is provided because rather than routing copper or other conductive wires to each switch, a less expensive plastic light conductor may be routed to each switch. Rather than using an independent electrical circuit to provide illumination to a switch, the present invention allows a single light conductor to be used for the dual purpose of signaling and illumination of the switch.

An optical switch according to the present invention is not subject to the corrosion in low current circuits nor wear due to sparks in high current circuits as described above with regard to electrical switches. In addition, optical signaling has improved reliability due to its immunity to EMI (electromagnetic interference) and RFI (radio frequency interference). Because EMI and RFI are prevalent in automotive vehicles and aircraft, the present invention is particularly well-suited for use in automotive vehicles and aircraft.

The teachings of the present invention may be applied to vehicles including, but not limited to, automobiles, trucks, aircraft, construction vehicles, marine vehicles, and agricultural vehicles. Although the teachings of the present invention are described with regard to vehicles, the teachings of the present invention are not limited to vehicles and are generally applicable to switching applications.

The teachings of the present invention may be implemented using switches having an appearance and providing tactile feedback similar to electrical switches. The present invention allows for cost savings due to reduced manufacturing and assembly costs because a standard mold may be used to form a standard configuration of transmitting and receiving light pipes. The standard configuration may then be easily adapted to a particular application by cutting off light pipes that are not needed.

The present invention is described above using a single light source to transmit light along multiple transmitting light pipes. Alternatively, an independent light source may be used to transmit light along each transmitting light pipe.

In an exemplary embodiment of the present invention, an incandescent light source is used to transmit light along the transmitting light pipes. In an exemplary embodiment, a color filter may then be used in combination with or coupled to a light transmitting tower to provide colored illumination of a corresponding portion of a switch cap. Alternatively, a colored blade adjacent to a light transmitting tower may be used to cause colored light to be transmitted by a light transmitting tower to provide colored illumination of a portion of a switch cap. Alternatively, a colored polycarbonate film may be placed under or printed onto a portion of a switch cap to provide colored illumination.

Although illustrated and described above with reference to certain specific embodiments, the present invention is nevertheless not intended to be limited to the details shown. Rather, various modifications may be made in the details within the scope and range of equivalents of the claims and without departing from the spirit of the invention.

What is claimed:

1. An optical switch comprising:
   a first transmitting light pipe having a first end and a second end;
   a first illumination source coupled to the second end of the first transmitting light pipe for transmitting light into the second end and toward the first end of the first transmitting light pipe;
   a first receiving light pipe having a first end and a second end, wherein the first end of the first receiving light pipe is aligned with and spaced from the first end of the first transmitting light pipe, forming a first gap therebetween;
   a switch cap including a first cap portion and a second cap portion; and
   a first light transmitting tower coupled to the first cap portion and extending from the first cap portion into the first gap when the switch cap is disposed in a first position of said switch cap and into a location away from the first gap when the switch cap is disposed in a second position of said switch cap,
   wherein when the switch cap is disposed in the first position, light transmitted by the first illumination source into the first transmitting light pipe is transmitted through the first end of the first transmitting light pipe and into the first light transmitting tower to illuminate the first portion of the switch cap and when the switch cap is disposed in the second position the light transmitted by the first illumination source into the first transmitting light pipe is transmitted through the first gap into the first receiving light pipe.

2. An optical switch according to claim 1 further comprising:
   a housing having a first side and a second side opposite the first side,
   wherein the first transmitting light pipe extends into or through the first side of the housing and the first receiving light pipe extends into or through the second side of the housing.

3. An optical switch according to claim 1 further comprising:
   a second light transmitting tower coupled to one of the first cap portion or the second cap portion, the second light transmitting tower extending from the one of the first cap portion or the second cap portion into the first gap when the switch cap is disposed in the second position and into a location away from the first gap when the switch cap is disposed in the first position,
   wherein when the switch cap is disposed in the second position, light transmitted by the first illumination source into the first transmitting light pipe is transmitted through the first end of the first transmitting light pipe and into the second light transmitting tower to illuminate the one of the first cap portion or the second cap portion.

4. An optical switch according to claim 1 further comprising:
   a second transmitting light pipe having a first end and a second end;
   a second receiving light pipe having a first end and a second end, wherein the first end of the second receiving light pipe is aligned with and spaced from the first end of the second transmitting light pipe, forming a second gap therebetween,
   wherein the first light transmitting tower extends into the second gap when the switch cap is disposed in the second position.

5. An optical switch according to claim 4 further comprising:
   a second illumination source coupled to the second end of the second transmitting light pipe for transmitting light into the second end and toward the first end of the second transmitting light pipe,
   wherein the second illumination source transmits light of a different wavelength than a wavelength of light transmitted by the first illumination source.

6. An optical switch according to claim 1 further comprising a first opaque blade extending from the switch cap and adjacent to the first light transmitting tower and extending, when the switch cap is in one of the first position or the second position, into the first gap to prevent light from being transmitted from the first transmitting light pipe to the first receiving light pipe in one of the first position or the second position.

7. An optical switch according to claim 6 wherein the first opaque blade comprises a first color and light transmitted along the first transmitting light pipe when the switch cap is disposed in the first position is directed up the first light transmitting tower to illuminate the first portion of the switch cap with the first color.

8. An optical switch according to claim 1 wherein the optical switch is one of a rocker switch, a toggle switch, a rotary switch, and a slider switch.

9. An optical switch according to claim 1 wherein the first light transmitting tower comprises substantially uniform optical quality plastic.

10. An optical switch according to claim 9 wherein at least the first portion and the second portion of the switch cap and the first light transmitting tower comprise at least one of polycarbonate and acrylic.

11. An optical switch according to claim 3 wherein the first light transmitting tower includes a first color filter corresponding to a first color and the second light transmitting tower includes a second color filter corresponding to a second color, wherein when the switch cap is disposed in the first position, light transmitted by the first illumination source into the first transmitting light pipe is transmitted through the first transmitting light pipe and into the first light transmitting tower to illuminate the first portion of the switch cap to the first color and when the switch cap is disposed in the second position, light transmitted by the first illumination source into the first transmitting light pipe is transmitted through the first transmitting light pipe and into the second light transmitting tower to illuminate the one of the first cap portion or the second cap portion to the second color.

12. An optical switch comprising:

a first transmitting light pipe;

a first receiving light pipe, wherein the first receiving light pipe is aligned with and spaced from the s first transmitting light pipe, forming a first gap therebetween;

a switch cap having a first position and a second position;

a first light transmitting tower coupled to the switch cap and extending from the switch cap into the first gap when the switch cap is disposed in at least one of the first position and the second position; and a first opaque blade extending from the switch cap and adjacent to the first light transmitting tower and extending, when the switch cap is in one of the first position or the second position, into the first gap to prevent light from being transmitted from the first transmitting light pipe to the first receiving light pipe.

13. An optical switch according to claim 12 wherein the first light transmitting tower extends into the first gap when the switch cap is in the first position, and extends away from the first gap when the switch cap is disposed in the second position.

14. An optical switch according to claim 12 wherein the first transmitting light pipe has a first end and a second end, the first receiving light pipe has a first end and a second end, and the first end of the first transmitting light pipe is aligned with and spaced from the first end of the first receiving light pipe to form the first gap therebetween and the optical switch further comprises a first illumination source coupled to the second end of the first transmitting light pipe for transmitting light into the second end and toward the first end of the first transmitting light pipe.

15. An optical switch according to claim 12 wherein the first light transmitting tower has a length longer than a length of the first opaque blade and the first light transmitting tower extends into the first gap when the switch cap is disposed in the first position and when the switch cap is disposed in the second position.

16. An optical switch according to claim 14 wherein the first light transmitting tower has a length approximately equal to a length of the first opaque blade, and the first light transmitting tower and the first opaque blade extend into the first gap and the first light transmitting tower is between the first opaque blade and the first end of the first light transmitting light pipe when the switch cap is disposed in the first position and the first light transmitting tower and the first opaque blade extend to a position away from the first gap when the switch cap is disposed in the second position.

17. An optical switch according to claim 14 wherein the first light transmitting tower has a length greater than a length of the first opaque blade, and the first light transmitting tower and the first opaque blade extend into the first gap and one of the first light transmitting tower and the first opaque blade is adjacent to the first light transmitting light pipe when the switch cap is disposed in the first position, and the first light transmitting tower extends into the first gap and the first opaque blade extends to a position away from the first gap when the switch cap is disposed in the second position.

18. An optical switch according to claim 14 further comprising a housing having a first side and a second side opposite the first side wherein the first transmitting light pipe extends through the first side of the housing and the first receiving light pipe extends through the second side of the housing.

19. An optical switch according to claim 12 wherein the optical switch is one of a rocker switch, a toggle switch, a rotary switch, and a slider switch.

20. An optical switch according to claim 12 wherein the first light transmitting tower comprises a substantially uniform optical quality plastic.

21. An optical switch according to claim 12 wherein at least a portion of the switch cap and the first light transmitting tower comprise at least one of polycarbonate and acrylic.

22. An optical switch according to claim 12 further comprising a light source for transmitting light through the first transmitting light pipe into the first gap.

23. A control system comprising:

(a) an optical switch including:

(i) a first transmitting light pipe having a first end and a second end;

(ii) a first receiving light pipe having a first end and a second end, wherein the first end of the first receiving light pipe is aligned with and spaced from the first end of the first transmitting light pipe, forming a first gap therebetween;

(iii) a switch cap having a first position and in a second position;

(iv) a first light transmitting tower coupled to the switch cap and extending from the switch cap into the first gap when the switch cap is disposed in at least one of the first position and the second position; and (v) a first opaque blade extending from the switch cap and adjacent to the first light transmitting tower and extending, when the switch cap is in one of the first position or the second position, into the first gap to prevent light from being transmitted to the first end of the first receiving light pipe;

(b) a first illumination source coupled to the second end of the first transmitting light pipe for transmitting light into the second end and toward the first end of the first transmitting light pipe;

(c) a controller for determining whether the switch cap is disposed in the first position or in the second position responsive to light detected at the second end of the first receiving light pipe and for controlling a load responsive to the determined position of the switch cap.

24. A method of using an optical switch including a switch cap having a first cap portion, the method comprising the steps of:

receiving light from a light source;

directing the light into a gap opposite a receiving light pipe;

selectively actuating the optical switch to one of a first position in which the light is transmitted across said gap to said light receiving pipe or a second position in which the light is directed away from said light receiving pipe; and transmitting the light from said gap to the first cap portion to illuminate the first cap portion when said switch is in at least one of said first position and said is second position.

25. A method according to claim 24, wherein:

the transmitting step comprises transmitting the light from said gap to the first cap portion to illuminate the first cap portion when said switch is in said first position; and the method further comprises transmitting the light from said gap to a second cap portion to illuminate the second cap portion when said switch is in said second position.

\* \* \* \* \*